United States Patent
Amatangelo et al.

(10) Patent No.: US 6,406,980 B1
(45) Date of Patent: Jun. 18, 2002

(54) PHYSICAL DESIGN TECHNIQUE PROVIDING SINGLE AND MULTIPLE CORE MICROPROCESSOR CHIPS IN A SINGLE DESIGN CYCLE AND MANUFACTURING LOT USING SHARED MASK SETS

(75) Inventors: Matthew J. Amatangelo, Austin; Christopher McCall Durham, Round Rock; Peter Juergen Klim, Austin; Stephen Larry Runyon, Pflugerville, all of TX (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 09/645,155

(22) Filed: Aug. 24, 2000

(51) Int. Cl.[7] .............................................. H01L 21/301
(52) U.S. Cl. ........................ 438/462; 438/401; 438/800; 438/17; 438/10
(58) Field of Search ................................. 438/462, 401, 438/5–13, 14–18, 800, 106

(56) References Cited

U.S. PATENT DOCUMENTS 6,020,217 A  *  2/2000  Kuisi et al. .................. 438/106

* cited by examiner

*Primary Examiner*—Craig Thompson
(74) *Attorney, Agent, or Firm*—Duke W. Yee; Anthony V. S. England; Stephen R. Loe

(57) ABSTRACT

A wafer design layout and method of producing multiple integrated chip types using a single set of masks for a wafer and then at the time the type of chip desired is known, using a few customizing steps to produce the final integrated chip is provided. In one embodiment, the wafer layout includes a plurality of groupings of components and a plurality of dicing channels separating each of the components from others of the components. After the particular type of integrated circuit chip desired is selected, the wafer may then have the final few layers processed and the chips removed using the appropriate dicing channels for the integrated circuit chip desired.

7 Claims, 3 Drawing Sheets

100
Wafer

200
Base Chip Physical Design

PHYSICAL DESIGN TECHNIQUE PROVIDING SINGLE AND MULTIPLE CORE MICROPROCESSOR CHIPS IN A SINGLE DESIGN CYCLE AND MANUFACTURING LOT USING SHARED MASK SETS

BACKGROUND OF THE INVENTION

1. Technical Field

The present invention relates generally to integrated circuit fabrication and, more particularly, to mask processing and chip design.

2. Description of Related Art

During the design of complex, highs-speed very large scale integrated circuit (VLSI) chips, such as, for example, microprocessors, trade-offs must be made for various reasons. One very important trade-off is chip size versus cost. This is a trade-off that directly influences design content. That is, highly complex microprocessors, which provide high performance, require large amounts of area, a fact that directly influences manufacturing costs exponentially. These high performance designs are then usually restricted to the high-end of the system spectrum.

However, the consumer marketplace is driven from the low-end. This means that cost is everything, even at the expense of performance. These two ideals are paradoxical for the chip design team(s). Designers, then, must focus on one spectrum or the other in a particular design cycle. This forces serialization of the design process, whereas one end of the spectrum (complex, high performance, costly or simple, low performance, cheap) is completed first, then the other is derived from the first.

In order to gain ultra-high performance, today's high performance microprocessors are now integrating multiple cores on a single chip/design (e.g., Spinnaker/Power4 Microprocessor, a product of the International Business Machines Corporation of Armonk, N.Y.). These designs are aimed at the high-end of the system spectrum. When the high-end product is completed, a lower performance, cheaper derivative is typically completed using a single core design (e.g., IBM's plan to follow Spinnaker with a single-core design). Furthermore, each of the designs may incorporate a separate on-board memory hierarchy and/or capacity. The net result of both projects is that both high and low end users/markets are satisfied. However, there is significant cost in such a serial design process because it requires, for example, all-new mask sets and manufacturing processes.

Therefore, it would be desirable to have a simple method to design and build both high and low end designs in a single step which utilize most of the same mask sets. Such a process would allow the introduction of both high end and low end products in a manufacturing process that is less serialized and in a manner that utilizes less manufacturing resources than is found using current methods. Such a single step method would lead to lower cost for both the low end and high end designs.

SUMMARY OF THE INVENTION

The present invention provides a wafer design layout and method of producing multiple integrated chip types using a single set of masks for a wafer and then at the time the type of chip desired is known, using a few customizing steps to produce the final integrated chip. In one embodiment, the wafer layout includes a plurality of groupings of components and a plurality of dicing channels separating each of the components from others of the components. After the particular type of integrated circuit chip desired is selected, the wafer may then have the final few layers processed and the chips removed using the appropriate dicing channels for the integrated circuit chip desired.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
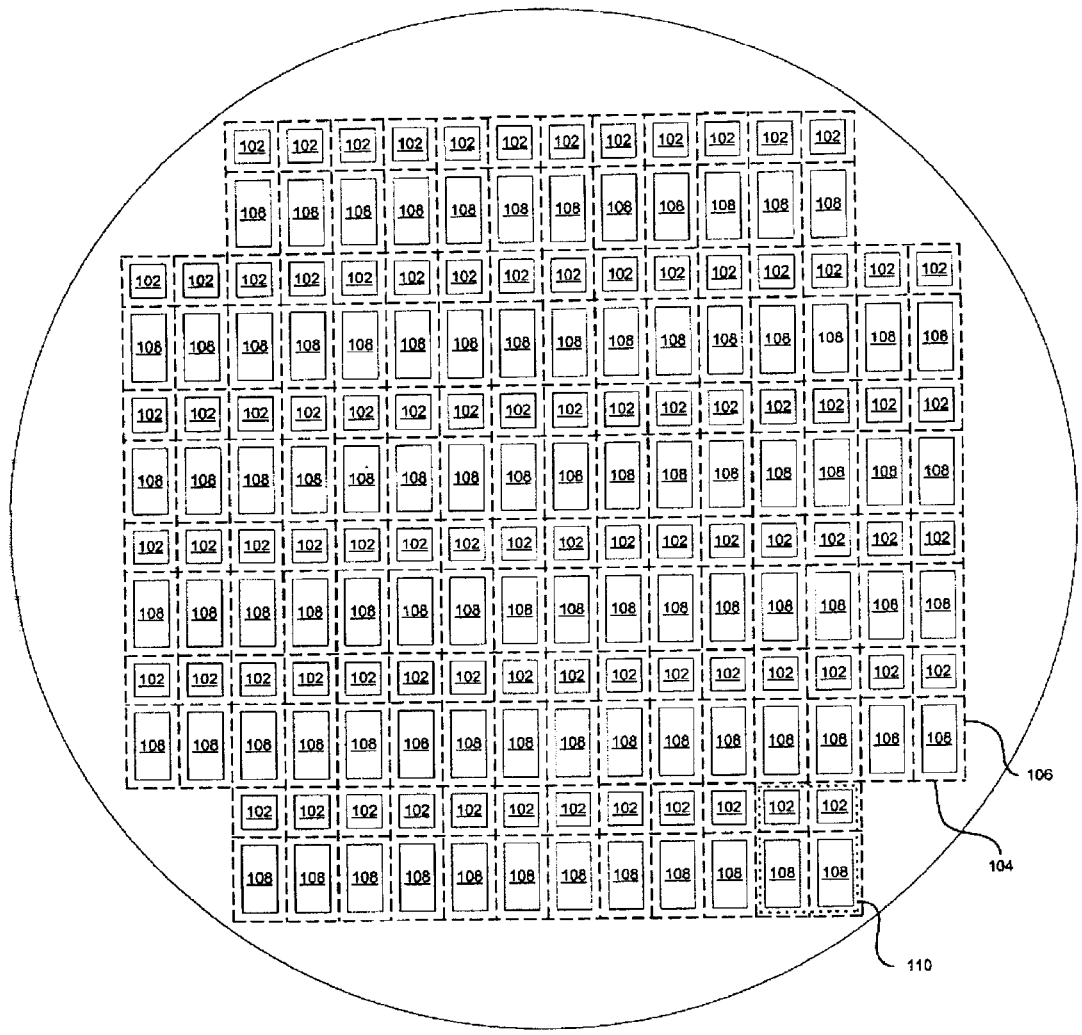
FIG. 1 depicts a schematic diagram illustrating a planar view of an exemplary wafer layout in accordance with the present invention.

With reference now to the figures and, in particular, with reference to FIG. 1, a schematic diagram illustrating a planar view of an exemplary wafer layout is depicted in accordance with the present invention. Wafer 100 is an example of a silicon crystal that has been processed through a series of photomasking, etching and implantation steps to produce a plurality of microprocessor cores 102 and memory subsystems 108 arranged in the array pattern depicted in FIG. 1. In typical embodiments, wafer 100 is approximately $\frac{1}{30}$ of an inch thick and around 12 inches in diameter. However, the size of wafer 100 is not important to the present invention as long as it is of a sufficient size to form the desired chip components for the particular implementation.

X-104 and Y-106 dicing channels lie between each core 102 or memory subsystem 108 and an adjacent core 102 or memory subsystem 108. The dicing channels 104 and 106 are used to separate the individual chips (also referred to as integrated circuits or dice) from other chips within wafer 100. In one embodiment, wafer 100 is mounted on a holder and automatically scribed in both the x and y directions using a diamond-tipped scribe creating dicing channels 104 and 106. Dicing channels 104 and 106, in one embodiment, are between 75 and 250 microns wide. Dicing channels 104 and 106 are left free of oxide and metal during the processing of the cores 104 and memory subsystems 108 on wafer 100.

All levels of cores 102 and memory subsystems 108 are processed except for a final layer (or layers), which contain the final metallization interconnect layer(s). These final metallization interconnect layers are used, among other purposes, for connecting the individual cores 102 and memory subsystems 108 to other cores 102 and or memory subsystems 108 as determined by the needs of a user at a later time. At such time as it is determined what customization is desired for the chip, the final cross core/memory system and logic necessary to delineate between multi-core and single-core implementations may be connected in the final metallization layers. The logic is formed in the underlying layers, but is connected to appropriate components or circuits using the metallization layers formed using the final masks. The individual chips may then be separated from wafer 100 along the appropriate dicing channels 104 and 106.

Many different end products may be formed from wafer 100. This is because the entire front-end mask set, including transistor formation levels as well as many metal (wiring) levels, for each product is identical up to the point shown in FIG. 1. The upper most mask sets are reserved for forming the logic connections and other cross core/memory subsystem connections as mentioned above. Thus, may wafers such as wafer 100 can be manufactured under mostly the same mask set and at the same time. Stockpiled wafers can then be personalized based on factors such as, for example, market demand and price/performance trade-offs.

An important point in the layout of components within wafer 100 that provides the flexibility to produce any different chip products using mostly the same mask set until the final layer or layers is that components that may end up being included together in a single chip must be laid out adjacent to each other on the wafer 100. For example, in FIG. 1, the most sophisticated chip intended to be produced from this wafer 100 is a chip having two processor cores 102 and a full memory subsystem (i.e. two of memory subsystems 108). Therefore, the components 102 and 108 are arranged adjacent to each other as shown in group 110. Furthermore, dicing channels must be included between individual components to allow for the creation of chips that include fewer than all the components possible in the most sophisticated chip that may be created from the wafer 100.

Wafer 100 is provided as an example of a wafer layout in which multiple end products may be created using the same initial mask sets and is not intended to imply any architectural or physical limitations of the present invention. For example, not all groups 110 must lie in a row or column of other groups, but may be offset somewhat in order to utilize as much of the available space of the wafer as possible.

Figure 2:
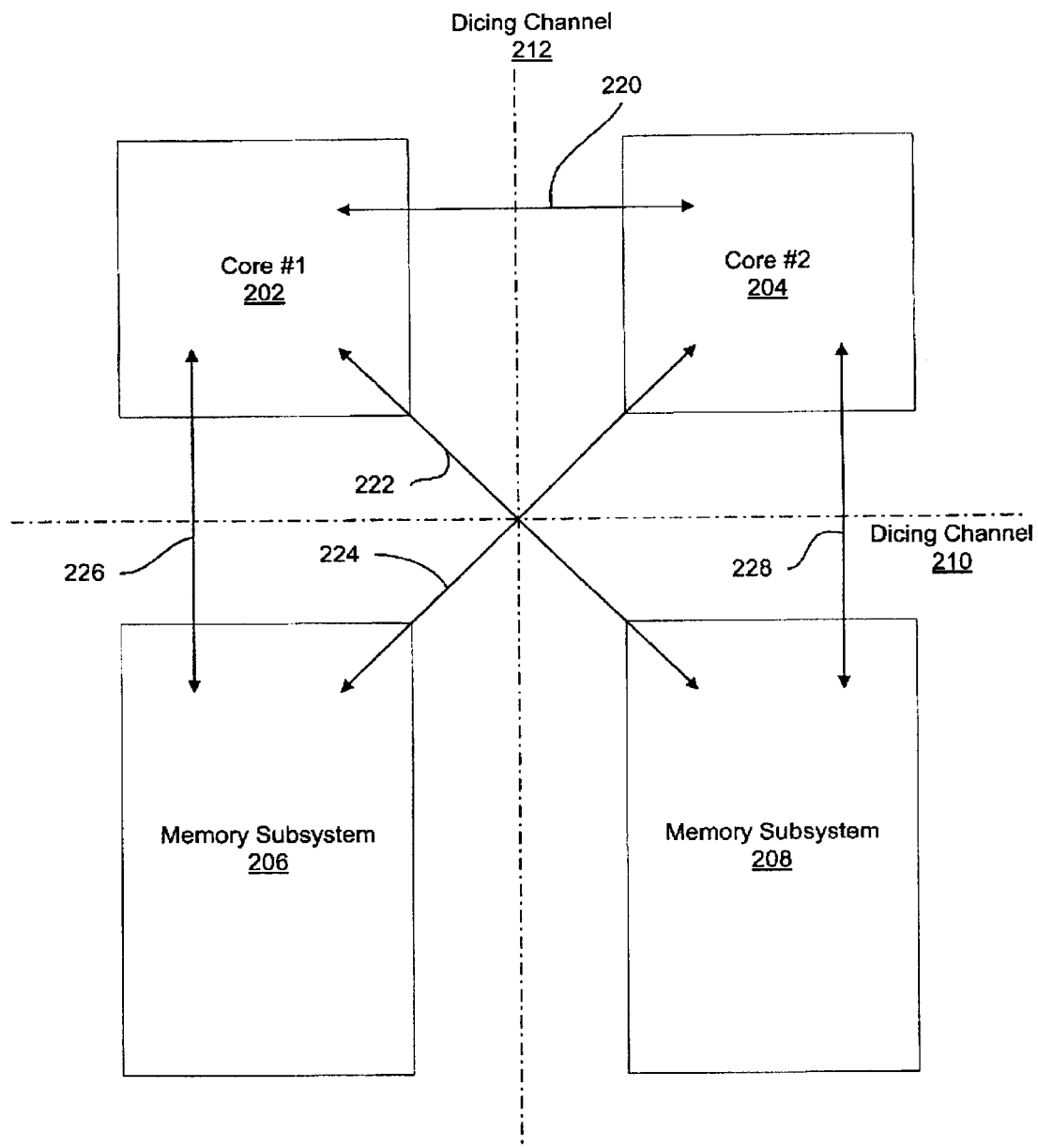
FIG. 2 depicts an enlarged block diagram of a section of a wafer in accordance with the present invention.

With reference now to FIG. 2, an enlarged block diagram of a section of a wafer, such as, for example, wafer 100, is depicted in accordance with the present invention. Base chip physical design 200 is an example of a grouping of components within a wafer such as, for example, group 110 within wafer 100 in FIG. 1. Base chip physical design 200 includes two cores 202 and 204 and memory subsystems 206 and 208. Cores 202 and 204 may be implemented as, for example, cores 102 in FIG. 1. Core #1 202 and core #2 204 may be identical or may be different depending on the particular desires of the designer. Memory subsystems 206 and 208 may be implemented as, for example, memory subsystems 108 in FIG. 1. Again, memory subsystem 206 may be identical to memory subsystem 208 or may be different depending on the needs and desires of the chip designer. Base chip physical design 200 also includes dicing channels 210 and 212 which correspond to one each of x-104 and y-106 dicing channels, respectively, in FIG. 1.

Base chip physical design 200 may be used to produce any one of the following product configurations:

1. Two processor cores with a larger memory subsystem;
2. One processor core with one-half the memory subsystem (i.e. two chips per instantiation);
3. One processor core without the memory subsystem; and
4. Two processor cores without the memory subsystem.

In order to produce two processor cores with a larger memory subsystem, interlace wiring elements 220–228 connecting each of the components 202–208 to each other would need to be formed during the final customizing processing steps. Interlace wiring elements 220–228 are depicted merely as lines to indicate which components are being connected and are not intended to illustrate the actual physical layout of the interlace wiring elements 220–228. Furthermore, interlace wiring elements 220–228 may consist of one or several "wires". Interlace wiring elements 220–228 provide signal interconnections between the various components 202–208 allowing the components 202–208 to communicate with each other and function as a whole. Also, during the final processing steps, the logic necessary to delineate that the chip is a multi-core chip is formed.

In order to form a one processor core with one-half the memory subsystem, interlace wiring elements 226 and 228 would be formed during the final processing steps. Thus, two chips of this type could be formed from base chip physical design 200: one containing core #1 202 connected to memory subsystem 206 via interlace wiring element 226 and one chip containing core #2 204 connected to memory subsystem 208 via interlace wiring 228. The chips are then separated from each other along dicing channel 212 to produce the two chips.

In order to form one processor core without the memory subsystem, no interlace wiring elements 220–228 are needed. The final processing steps are needed merely to form the final logic indicating that the chip is a single core processor without a memory subsystem. The chips are then separated from each other and the wafer along dicing channels 210 and 212. Two such single core chips could be produced from base chip physical layout 200.

In order to produce a chip with two processor cores without the memory subsystem, interlace wiring element 220 is formed during the final processing steps to functionally couple core #1 202 to core #2 204. The logic elements needed to identify the chip as a two core chip, although formed during the earlier processes in which all other transistors, etc. were formed, are now connected to appropriate circuit components during these final processing steps.

The list of possible chips that could be fabricated using base chip physical layout 200 is not intended to be exhaustive. A partial-good strategy could be employed to expand the list above. For example, if one-half of the memory subsystem (e.g., memory subsystem 208 was failing, but memory subsystem 206 was good), a design consisting of two cores and the working half of the memory subsystems could be used. Furthermore, this technique can be expanded across more than two cores and/or memory subsystems. For example, this technique could be modified to produce a four core structure with some memory subsystem.

The designs and processes of the present invention do not come without some cost. Additional design time and resources are required to complete such a customized design for each type of product. Depending on the complexity of the processor, this could be a significant impact. However, the cost of customizing the chip for final processing does not approach the cost of serialization of the designs in terms of factors, such as, for example, time to market and resource, regardless of the manpower overhead involved. Also, the addition of dicing channels does consume some amount or area on the wafer, but such dicing channel area is small compared with other savings provided by the present invention.

Figure 3:
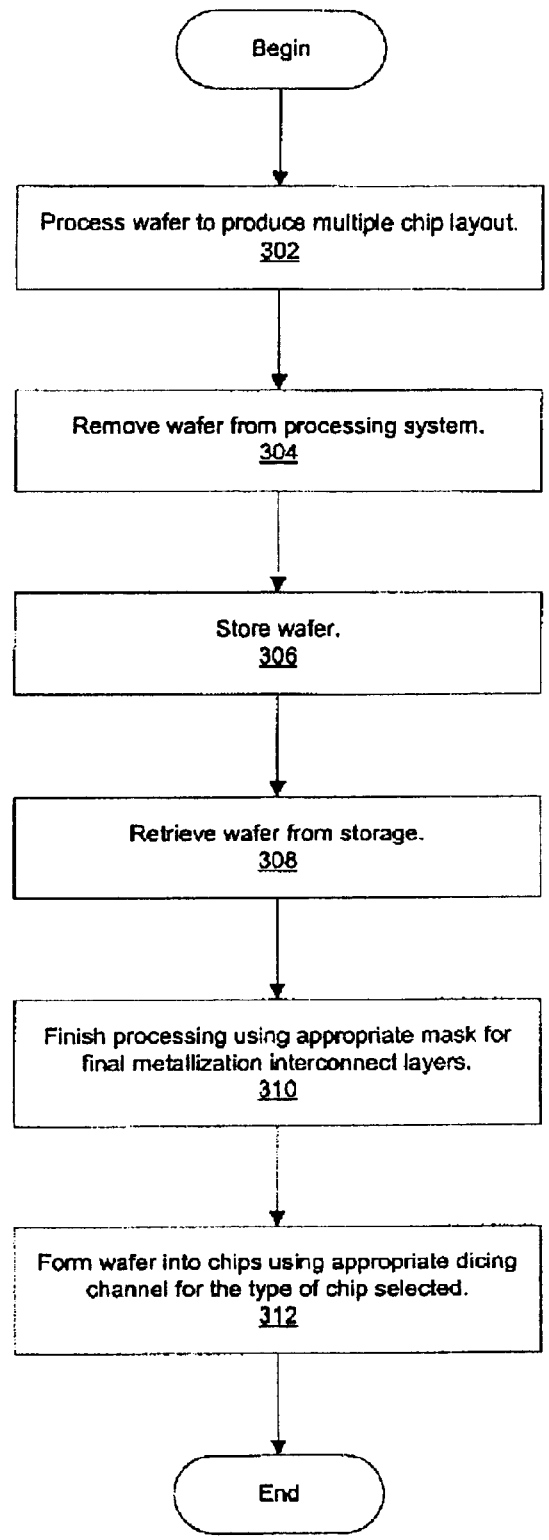
FIG. 3 depicts a flowchart illustrating an exemplary process for fabricating customized chips using one set of mask sets for all but the final levels of processing in accordance with the present invention.

With reference now to FIG. 3, a flowchart illustrating an exemplary process for fabricating customized chips using one set of mask sets for all but the final levels of processing is depicted in accordance with the present invention. To begin, a wafer is processed using a series of photomasking, etching and implantation steps to produce a wafer containing partially fabricated components (step 302). The components have been laid out on the chip in such a way that several different chips can be produced from these partially fabricated components depending on customization steps performed later. Also, dicing channels will be formed between each component to allow for separation of the chips from the wafer. Thus, regardless of what type of customized chip from the list of possible chips is desired, this first stage in the production of the chips uses one set of mask sets.

The wafer is then removed from the processing system (step 304) and stored (step 306) until an order for a customized chip is received. The wafer is then retrieved from storage (step 308) and placed into a final processing area where the wafer is processed using the appropriate mask sets and other processes in order to complete the desired chip (step 310). The finished wafer is then formed into the desired chips by separating the chips from the wafer using the appropriate dicing channels for the type of chip selected (step 312).

Although the present invention has been described primarily in terms of silicon wafers, one skilled in the art will recognized that other types of semiconducting material may be used as well. Furthermore, the present invention is not limited to processors and memory subsystems, but may be applied to any type of electronic devices that may be fabricated in a semiconducting material.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of fabricating an integrated circuit, the method comprising:
    partially fabricating a plurality of integrated circuit components on a semiconducting wafer;
    creating dice channels between each of the plurality of integrated circuit components;
    wherein the plurality of integrated circuit components are arranged such that a variety of different types of integrated circuit chips may be produced depending on a customized set of final processing steps.

2. The method as recited in claim 1, wherein the semiconducting wafer comprises a silicon crystal.

3. The method as recited in claim 1, further comprising:
    storing the wafer; and
    responsive to a determination of a type of integrated circuit chip desired to be produced, finishing processing the wafer.

4. The method as recited in claim 1, further comprising:
    responsive to a determination of a type of integrated circuit chip desired to be produced, finishing processing the wafer.

5. The method as recited in claim 1, further comprising:
    after performing customized finishing processing steps, separating the integrated circuit chip from the wafer using the appropriate dicing channels for the type of integrated circuit desired.

6. The method as recited in claim 5, wherein the customized finishing processing steps comprise fabricating connections between the appropriate components included into the integrated circuit chip.

7. The method as recited in claim 1, wherein the step of partially fabricating a plurality of integrated circuit components on a semiconducting wafer comprises fabricating all transistors and interconnects included in each integrated circuit component.

\* \* \* \* \*